(12) United States Patent
Millard et al.

(10) Patent No.: US 8,279,613 B2
(45) Date of Patent: Oct. 2, 2012

(54) FLEXIBLE CIRCUIT ASSEMBLIES WITH STACKED FLEX INTERCONNECTS AND CONNECTOR ASSEMBLIES HAVING THE SAME

(75) Inventors: Steven Jay Millard, Mechanicsburg, PA (US); Richard Elof Hamner, Hummelstown, PA (US); Robert Neil Mulfinger, York Haven, PA (US); Jason M'Cheyne Reisinger, Carlisle, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 35 days.

(21) Appl. No.: 12/947,533

(22) Filed: Nov. 16, 2010

(65) Prior Publication Data

US 2012/0120607 A1    May 17, 2012

(51) Int. Cl.
*H05K 1/00* (2006.01)
(52) U.S. Cl. ...................................................... 361/749
(58) Field of Classification Search .......... 361/688–691, 361/700, 749, 756, 801
See application file for complete search history.

(56) References Cited

U.S. PATENT DOCUMENTS

| 7,626,817 | B2 | 12/2009 | Rapp |
| 7,794,233 | B1 | 9/2010 | Millard et al. |
| 2005/0275589 | A1 | 12/2005 | Wilson |
| 2005/0286228 | A1 | 12/2005 | Kim |

FOREIGN PATENT DOCUMENTS

EP    1610607 A1    12/2005

OTHER PUBLICATIONS

European Search Report, European Search Report No. EP 11 18 9155, European Filing Date Nov. 11, 2011.

*Primary Examiner* — Timothy Thompson
*Assistant Examiner* — Tremesha S Willis

(57) ABSTRACT

A flexible circuit assembly including a pair of mating panels. Each of the mating panels has an engagement face and a power contact. The circuit assembly also includes adjacent first and second flex interconnects that mechanically and electrically couple the mating panels. The first and second flex interconnects extend alongside each other and have respective interior surfaces. The first and second flex interconnects are stacked with respect to each other such that the interior surfaces face each other and define a heat-dissipating interspace therebetween. The circuit assembly also includes a plurality of power conductors that extend through the first and second flex interconnects between the mating panels. The power conductors are electrically parallel to one another between the power contacts. At least one of the power conductors extends proximate to the interior surface of one of the first and second flex interconnects.

20 Claims, 6 Drawing Sheets

FLEXIBLE CIRCUIT ASSEMBLIES WITH STACKED FLEX INTERCONNECTS AND CONNECTOR ASSEMBLIES HAVING THE SAME

BACKGROUND OF THE INVENTION

The subject matter herein relates generally to flexible circuit assemblies and connector assemblies, and more particularly, to flexible circuit assemblies that are configured to control thermal energy distribution.

Some communication systems, such as servers, routers, and data storage systems, utilize flexible circuit assemblies for transmitting data signals and electrical power through the system. Known flexible circuit assemblies have a power line that includes a power conductor and a corresponding ground conductor. The power conductor has predetermined dimensions that permit the transmission of a desired amount of power between electrical components. However, when power is conveyed through the flexible circuit assembly, thermal energy is generated and dissipated into the surrounding area. In some cases, the thermal energy may cause the temperature of the surrounding area to exceed predetermined temperature limits, such as those established by customers or industry standards.

U.S. Pat. No. 7,626,817 proposes a three-dimensional electronic assembly that includes a plurality of flex circuit sub-assemblies that are joined together at opposite ends. The flex circuit sub-assemblies in the '817 Patent are separated from each other by spacers between the opposite ends and may include various heat transfer mechanisms to cool the flex circuit sub-assemblies. However, the proposed heat transfer mechanisms may be impractical for certain applications. For example, the '817 Patent proposes using embedded heat sinks or heat pipes, liquid transfer mechanisms, and also an enclosure that is designed to operate as a heat sink. Such mechanisms may limit a range of movement of the flex circuit sub-assemblies and/or may significantly increase the costs of manufacturing the flex circuit sub-assemblies.

Accordingly, there is a need for flexible circuit assemblies and connector assemblies that facilitate controlling thermal energy generated during operation of the circuit and connector assemblies. Furthermore, there is a need for flexible circuit assemblies and connector assemblies that permit transmitting greater amounts of power than known circuit and connector assemblies. There is also a general need for alternative circuit and connector assemblies that are capable of delivering power between electrical components.

BRIEF DESCRIPTION OF THE INVENTION

In one embodiment, a flexible circuit assembly is provided that includes a pair of mating panels. Each of the mating panels has an engagement face and a power contact thereon that is configured to electrically engage a corresponding electrical component. The circuit assembly also includes adjacent first and second flex interconnects that mechanically and electrically couple the mating panels. The first and second flex interconnects extend alongside each other and have respective interior surfaces. The first and second flex interconnects are stacked with respect to each other such that the interior surfaces face each other and define a heat-dissipating interspace therebetween. The circuit assembly also includes a plurality of power conductors that extend through the first and second flex interconnects between the mating panels. The plurality of power conductors are electrically parallel to one another between the power contacts of the pair of mating panels. At least one of the power conductors extends proximate to the interior surface of one of the first and second flex interconnects so that thermal energy is dissipated into the interspace.

In another embodiment, a connector assembly is provided that includes a connector that extends along a longitudinal axis. The connector includes a moveable side that is configured to move between retracted and engaged positions and also a mounting side. The connector assembly includes a flexible circuit assembly that has a pair of mating panels. Each of the mating panels has an engagement face and a power contact thereon that is configured to electrically engage a corresponding electrical component. The mounting side has one of the mating panels secured thereto and the moveable side has the other mating panel secured thereto. The circuit assembly also includes adjacent first and second flex interconnects that mechanically and electrically couple the mating panels. The first and second flex interconnects extend alongside each other and have respective interior surfaces. The first and second flex interconnects are stacked with respect to each other such that the interior surfaces face each other and define a heat-dissipating interspace therebetween. The circuit assembly also includes a plurality of power conductors that extend through the first and second flex interconnects between the mating panels. The plurality of power conductors are electrically parallel to one another between the power contacts of the pair of mating panels. At least one of the power conductors extends proximate to the interior surface of one of the first and second flex interconnects so that thermal energy is dissipated into the interspace.

DETAILED DESCRIPTION OF THE INVENTION

Figure 1:
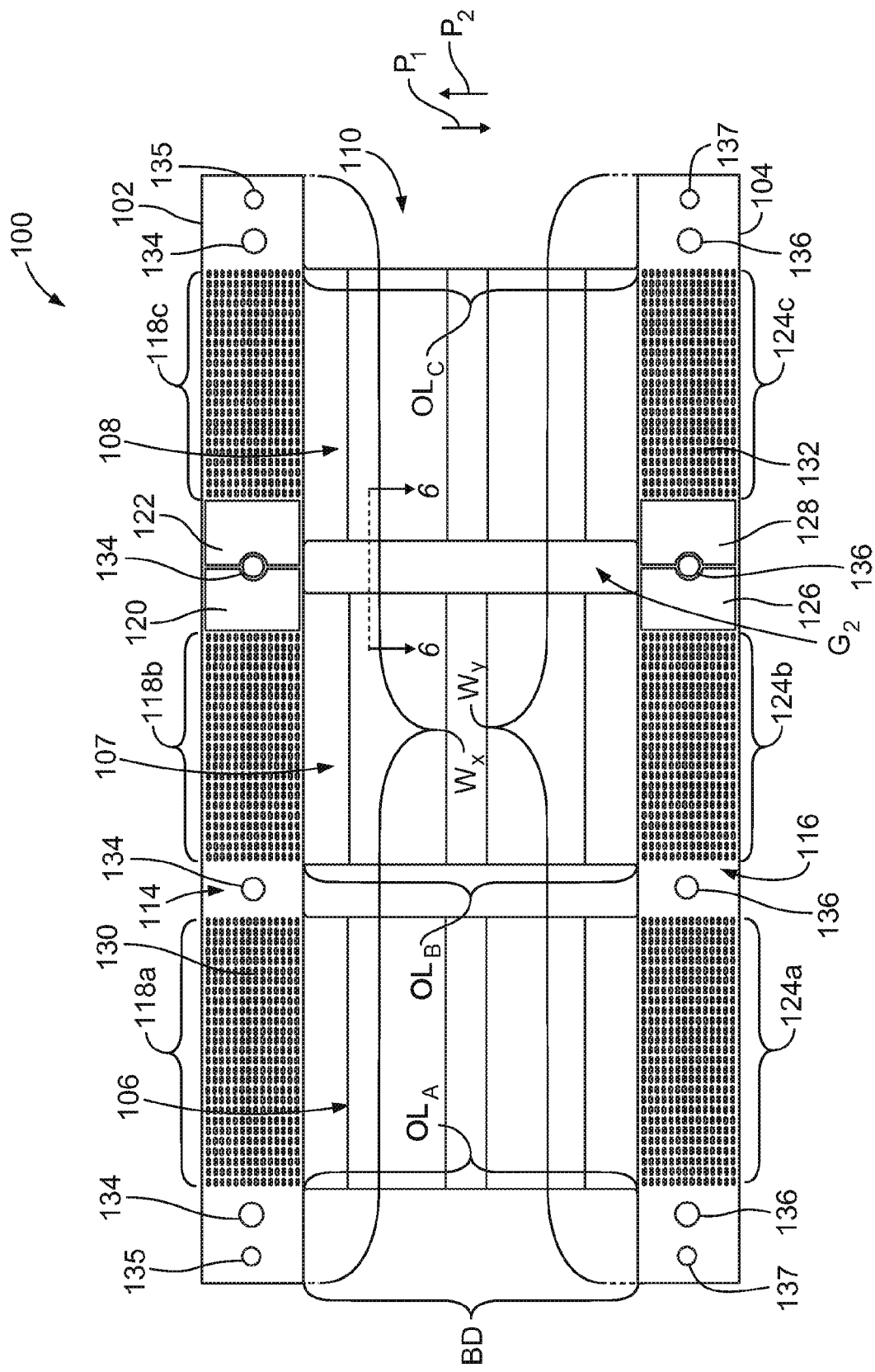
FIG. 1 is a plan view of a flexible circuit assembly formed in accordance with one embodiment.

Embodiments described herein include flexible circuit assemblies and connector assemblies that include such circuit assemblies. The circuit and connector assemblies may be configured to establish power connections between different electrical components. The circuit assemblies and corresponding connector assemblies may also be configured to establish at least one of an electrical and optical connection to transmit data signals between different electrical components. Electrical components that may be interconnected by the circuit and connector assemblies may be printed circuits (e.g., circuit boards or flex circuits), electrical devices, connectors (e.g., optical and/or electrical connector assemblies), or any other components/devices that are capable of establishing a power connection. In particular embodiments, the connector assemblies may include one or more moveable sides that are movable between retracted and engaged positions with respect to an electrical component.

By way of example, embodiments described herein include flex interconnects that extend between and mechanically and electrically join separate mating panels. The mating panels may have power and ground contacts and, optionally, terminals that are configured to transmit data signals when the mating panels are engaged to other electrical components. To this end, the flex interconnects may include conductors (e.g., embedded traces) that convey current between the mating panels. The conductors of the flexible circuit assembly may include signal conductors, power conductors, and ground conductors. The signal conductors are configured to transmit data signals between different electrical components. The power conductors electrically connect the power contact(s) of one mating panel to the power contact(s) of another mating panel in order to transmit power between the different electrical components. The ground conductors may electrically connect the ground contact(s) of one mating panel to the ground contact(s) of another mating panel. In some embodiments, the power conductors are electrically parallel to one another between the power contacts. Furthermore, the ground conductors may also be electrically parallel to one another between the ground contacts.

Embodiments described herein may utilize the electrically parallel power conductors to control thermal energy (or heat) dissipation of the flexible circuit assembly. For example, the power conductors may be disposed within the flex interconnects so that the conductors are proximate to ambient air. In particular embodiments, two or more flex interconnects are stacked with respect to each other and are separated by a heat-dissipating interspace(s). As will be described in greater detail below, the heat-dissipating interspace(s) may permit the use of conductors with larger surface areas than known flex interconnects for controlling the heat dissipation of the flexible circuit assembly. Furthermore, the heat-dissipating interspace(s) may allow an increased amount of copper to be used by the conductors as compared to known flex interconnects. Other features, dimensions, and configurations of the embodiments described herein may also facilitate controlling heat dissipation.

FIG. 1 is a plan view of a flexible circuit assembly 100 formed in accordance with one embodiment. The flexible circuit assembly 100 includes a pair of mating panels 102 and 104 that are mechanically and electrically joined by first and second flex interconnects 110 and 112 (shown in FIG. 2) that extend between and join the mating panels 102 and 104. The first flex interconnect 110 overlaps or overlays the second flex interconnect 112 in FIG. 1. The first and second flex interconnects 110 and 112 may include one or more flex sections that extend from the mating panel 102 to the mating panel 104. As shown in FIG. 1, the first flex interconnect 110 may include flex sections 106-108. As will be described in greater detail below, each of the flex sections 106-108 may include at least one of signal conductors, power conductors, ground conductors, and impedance-control shields that extend from the mating panel 102 to the mating panel 104.

The first and second flex interconnects 110 and 112 may be stacked with respect to each other so that a heat-dissipating interspace 234 (FIG. 3) exists therebetween. At least some of the thermal energy generated by the first and second flex interconnects 110 and 112 may dissipate into the interspace 234. In the illustrated embodiment, the flexible circuit assembly 100 includes only two flex interconnects. However, in alternative embodiments, the flexible circuit assembly 100 may include more than two flex interconnects or only one flex interconnect. For example, an alternative circuit assembly may include three flex interconnects that are stacked adjacent to each other and define two heat-dissipating interspaces. The term "first and second" as used in the claims does not exclude the possibility of a third flex interconnect or more than three flex interconnects.

The mating panels 102 and 104 have respective engagement faces 114 and 116 that are configured to engage respective electrical components (not shown). The engagement face 114 may include one or more mating arrays 118A, 118B, and 118C and also power and ground contacts 120 and 122. Similarly, the engagement face 116 may include one or more mating arrays 124A, 124B, and 124C and power and ground contacts 126 and 128. In the illustrated embodiment, the flex section 106 electrically connects the mating arrays 118A and 124A, the flex section 107 electrically connects the mating arrays 118B and 124B, and the flex section 108 electrically connects the mating arrays 118C and 124C. The mating panels 102 and 104 are separated from each other by bridge distance BD. The flex sections 106-108 have operative lengths $OL_A$, $OL_B$, and $OL_C$, respectively. In the illustrated embodiment, the operative lengths $OL_A$, $OL_B$, and $OL_C$ are about equal with respect to each other (i.e., there may be small differences due to manufacturing tolerances).

As shown in FIG. 1, the flexible circuit assembly 100 is in an unfolded (or planar) condition. In the unfolded condition, the flex sections 106-108 may extend along a common plane (i.e., the flex sections 106-108 may be coplanar with respect to each other). In the unfolded condition, the bridge distance BD that separates the mating panels 102 and 104 is at a maximum value or distance. When the operative lengths $OL_A$, $OL_B$, and $OL_C$ of the flex sections 106-108 are about equal to the maximum bridge distance BD, the flex sections 106-108 may be planar sheets of material without bowing or bulging.

Each of the mating arrays 118A-118C may include a plurality of terminals 130, and each of the mating arrays 124A-124C may include a plurality of terminals 132. The terminals 130 and 132 may be contact terminals (also referred to as mating contacts) or optical terminals. The contact terminals are configured to transmit an electrical current, and the optical terminals are configured to transmit optical data signals through total internal reflection. As shown, the terminals 130 and 132 are arranged in a predetermined configuration in the respective mating arrays. The terminals 130 and 132 may be held together by a common structure or base material. A variety of contact terminals may be used, including contact terminals that are stamped and formed, etched and formed, solder ball contacts, contact pads, press-fit contacts, and the like. The mating arrays 118A-118C and 124A-124C may also include optical terminal arrays having optical terminals configured to establish an optical connection. In some embodiments, the mating arrays 118A-118C and 124A-124C may include both contact terminals and optical terminals.

In the illustrated embodiment, the mating arrays 118A-118C may be located side-by-side in a linear manner along a width $W_X$ of the mating panel 102. Likewise, the mating arrays 124A-124C may be located side-by-side in a linear manner along a width $W_Y$ of the mating panel 104. Also, in particular embodiments, the mating panels 102 and 104 have similar dimensions.

As shown in FIG. 1, each of the mating panels 102 and 104 may include one or more mounting holes 134 and 136, respectively, that are configured to receive fasteners (e.g., screws, plugs, and the like) to secure the mating panels to support structures. The mating panels 102 and 104 may also be secured to support structures using an adhesive or clips such that mounting holes are not required. The mating panels 102 and 104 may be mounted to an electrical component and/or a connector assembly. In particular embodiments, the mating panels 102 and 104 are mounted to a connector assembly that is configured to removably couple one or both of the mating panels 102 and 104 to the corresponding electrical component. In addition to the mounting holes 134 and 136, the mating panels 102 and 104 may also have alignment holes 135 and 137, which have tighter tolerances than the mounting holes 134 and 136.

Figure 2:
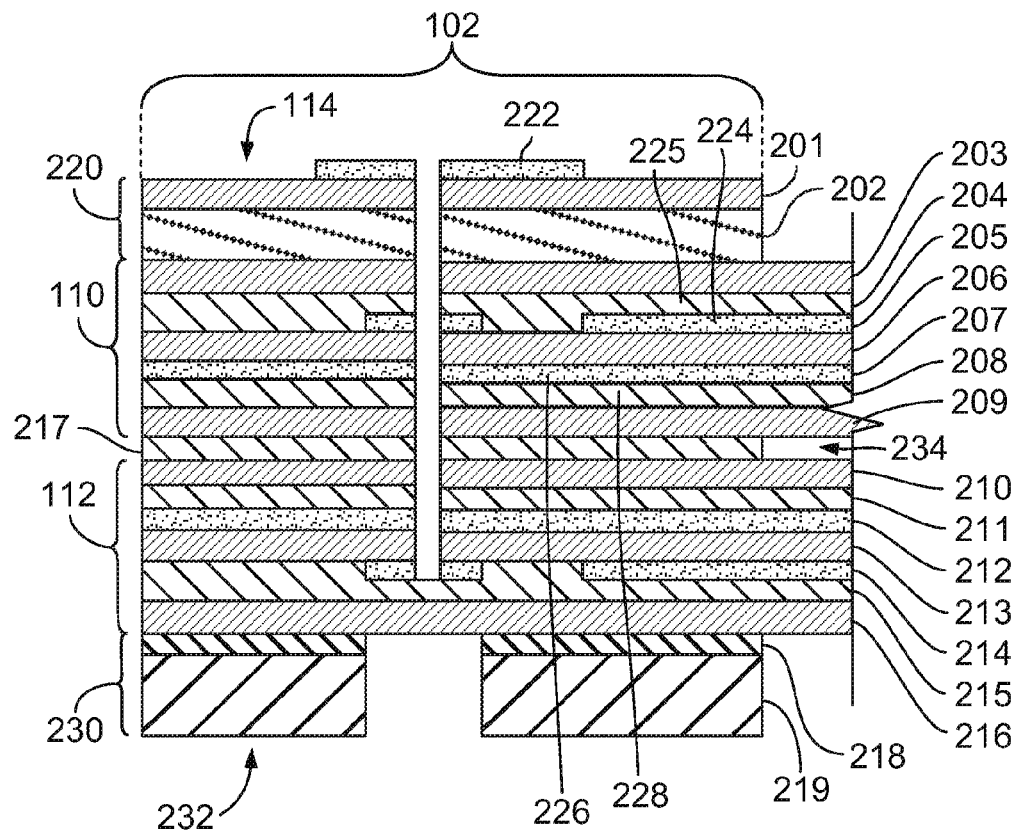
FIG. 2 is a schematic side view of a mating panel of the circuit assembly shown in FIG. 1.
Figure 3:
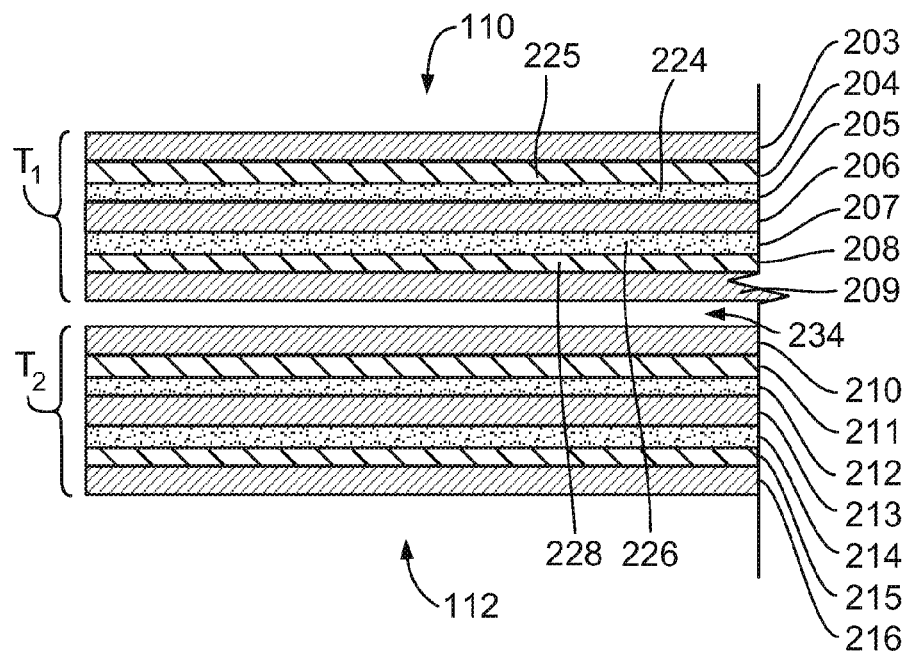
FIG. 3 is a schematic side view of first and second flex interconnects of the circuit assembly shown in FIG. 1.

FIG. 2 is a schematic side view of the mating panel 102, and FIG. 3 is a schematic side view of portions of the flex interconnects 110 and 112 extending between the mating panels 102 and 104 (FIG. 1). Although the following description with respect to FIG. 2 is with reference to the mating panel 102, the description may be similarly applied to the mating panel 104. In the illustrated embodiment, the mating panels 102 and 104 may include portions of the flex interconnects 110 and 112. For example, the flexible circuit assembly 100 (FIG. 1) may be a composite structure that includes a plurality of stacked layers 201-219. Some of the stacked layers 201-219 may extend entirely between and be a portion of the mating panels 102 and 104. By way of example, the stacked layers 201-219 may include flex layers that comprise a flexible and insulating material (e.g., polyimide); rigid layers (or stiffeners) that comprise a rigid material (e.g., FR-4, polyimide, polyimide glass, metals, and the like); bonding layers that comprise a bonding material (e.g., acrylic adhesive, modified epoxy, phenolic butyral, pressure-sensitive adhesive (PSA), preimpregnated material, and the like); coupling layers that include at least one of a bonding material, rigid material, or flex material; and signal and impedance-control layers that include a conductive material that is disposed, deposited, or etched in a predetermined manner. Layers may include sub-layers of, for example, bonding material, conductive material, and/or rigid material. The conductive material may be copper (or a copper-alloy), cupro-nickel, silver epoxy, and the like. The different stacked layers 201-219 may be electrically coupled to one another through thru-holes or vias or other mechanisms/devices.

As shown in FIG. 2, the mating panel 102 includes a flex layer 201 and a rigid layer 202 that directly interface with each other. As used herein, two layers directly interface with each other when the two layers directly contact each other along respective surfaces or have a small amount of adhesive therebetween to facilitate coupling the layers. Two layers that directly interface with each other do not have any intervening flex or rigid layers therebetween. With respect to FIG. 2, each of the stacked layers 201-219 directly interfaces at least one other stacked layer. Two stacked layers that directly interface each other may also be referred to as adjacent stacked layers. The flex layer 201 includes the engagement face 114 of the mating panel 102. The engagement face 114 may have a conductive material 222 (e.g., copper) disposed thereon. The conductive material 222 may form contact terminals of one or more of the mating arrays 118 (FIG. 1) or the power and ground contacts 120 and 122 (FIG. 1). As shown, the flex layer 201 and the rigid layer 202 may constitute a panel board 220 of the mating panel 102.

As shown in FIGS. 2 and 3, the flex interconnect 110 may comprise the stacked layers 203-209. More specifically, the flex interconnect 110 includes an outer layer 203 that directly interfaces with a bonding layer 204; the bonding layer 204 directly interfaces with a signal layer 205; the signal layer 205 directly interfaces with a flex layer 206; the flex layer 206 directly interfaces with a impedance-control layer 207; the impedance-control layer 207 directly interfaces with a bonding layer 208; and the bonding layer 208 directly interfaces with an inner layer 209. Although FIGS. 2 and 3 illustrate a particular arrangement of stacked layers, alternative arrangements and configurations of the stacked layers may be used in other embodiments.

The outer layer 203 may be a flex layer that comprises a flexible material. The inner layer 209 may also be a flex layer that comprises a flexible material. The signal layer 205 may also be referred to as a conductive layer and includes conductive material 224 that may be disposed in a desired pattern to form at least one of signal conductors, power conductors, and ground conductors. On the opposite side of the flex layer 206, the impedance-control layer 207 may include conductive material 226 that facilitates shielding and/or controlling the impedance of the flex interconnect 110. The impedance-control layer 207 may also be referred to as a conductive layer. The conductive material 226 may also be disposed to form power and ground conductors in the impedance-control layer 207.

The bonding layers 204 and 208 include bonding materials 225 and 228, respectively, that may be, for example, an acrylic adhesive. However, the bonding materials 225 and 228 are not required to be the same material and different materials may be used in other embodiments. Because the signal and impedance-control layers 205 and 207 may be patterned (i.e., by removing the conductive material 224 and 226 thereby exposing the flex layer 206), the bonding material 225 and 228 may extend into the signal and impedance-control layers 205 and 207 and, for example, contact the flex layer 206.

Thus, in the illustrated embodiment, the flex interconnect 110 includes stacked layers 203-209, including three flex layers 203, 206, 209 that are stacked with two bonding layers 204 and 208 and two conductive layers 205 and 207 (i.e., the signal layer 205 and the impedance-control layer 207). However, FIGS. 2 and 3 illustrate one particular embodiment. Alternative arrangements and configurations of the stacked layers may be used in other embodiments, With respect to FIG. 2, the flex interconnect 112 is mechanically and/or electrically coupled to the flex interconnect 110 through a coupling layer 217. For example, the coupling layer 217 may comprise a bonding material (e.g., acrylic adhesive) in addition to rigid material or flex material (not shown), such as those described herein. The coupling layer 217 may also include a conductive material (not shown) for transmitting the power and data signals therethrough between the flex interconnects 110 and 112. The conductive material may be plated along thru-holes or vias. In particular embodiments, the coupling layer 217 may only be located within the mating panels 102 and 104. As such, a heat-dissipating interspace 234 may exist between the flex interconnects 110 and 112. In some embodiments, a size of the interspace 234 is determined by dimensions of the coupling layer 217. In the illustrated embodiment, the coupling layer 217 comprises only a bonding material and a conductive material. However, in other embodiments, the coupling layer may include a rigid layer or material. As will be described in greater detail below, the interspace 234 may facilitate controlling an operating temperature of the flexible circuit assembly 100 (FIG. 1) by distributing thermal energy generated by the conductors. Furthermore, the interspace 234 may permit the use of larger amounts of copper in the conductors (described below) as compared to other known flexible circuit assemblies. Also shown in FIG. 3, the flex interconnects 110 and 112 may have respective thicknesses $T_1$ and $T_2$.

Also shown in FIGS. 2 and 3, the flex interconnect 112 includes stacked layers 210-216 that are similar to the stacked layers 203-209 of the flex interconnect 110. However, the flex interconnect 112 may be flipped with respect to the flex interconnect 110 such that the stacked layers 210-216 occur in reverse order with respect to the stacked layers 203-209. More specifically, the flex interconnect 112 may include an inner layer 210 that directly interfaces with a bonding layer 211. The bonding layer 211 may interface with an impedance-control layer 212. The impedance-control layer 212 directly interfaces a flex layer 213 that, in turn, directly interfaces with a signal layer 214. The signal layer 214 directly interfaces with a bonding layer 215. The bonding layer 215 directly interfaces with an outer layer 216. Thus, in the illustrated embodiment, the flex interconnect 112 includes stacked layers 210-216.

Also shown in FIG. 2, the mating panel 102 may include a panel board 230 that includes a bonding layer 218 and a rigid layer 219 that directly interfaces the bonding layer 218. The panel board 230 may include a mounting face 232 of the mating panel 102. The mounting face 232 may be configured to be secured to a support structure (not shown), such as a moveable or stationary side of a connector assembly. In the illustrated embodiment, the mounting face 232 does not include terminals or power and ground contacts. However, in alternative embodiments, the mounting face 232 may include at least one of terminals, power contacts, and ground contacts.

Figure 4:
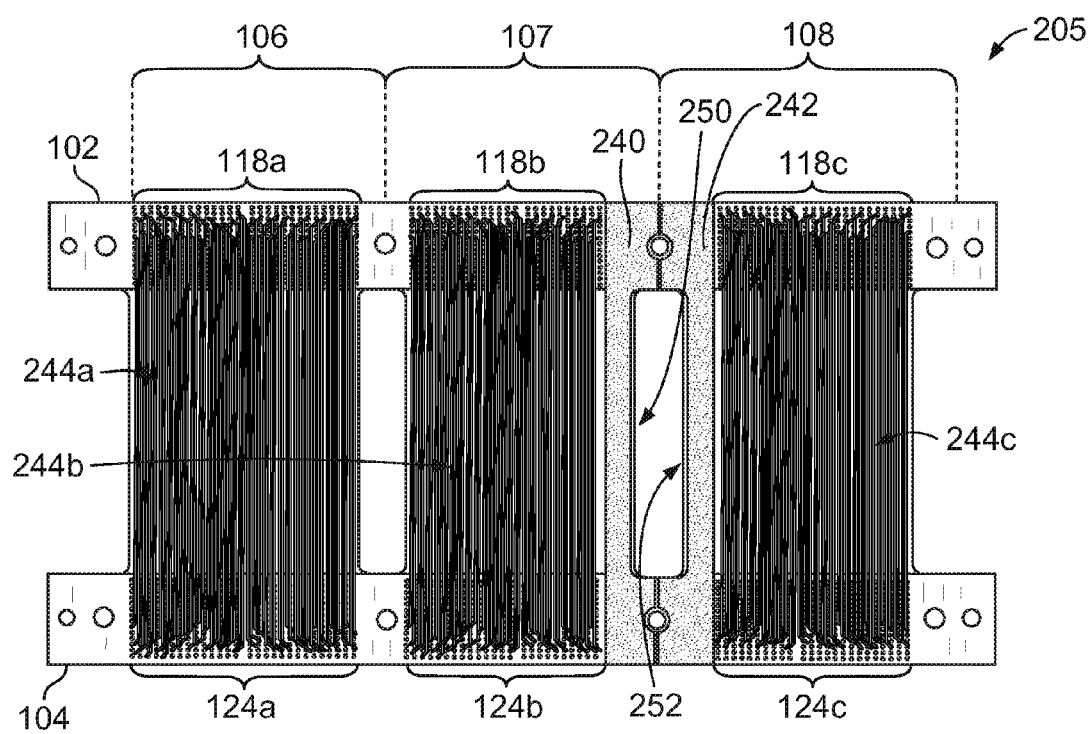
FIG. 4 is a plan view of a signal layer of the circuit assembly shown in FIG. 1.

FIG. 4 is a plan view of the signal layer 205 of the flex interconnect 110 (FIG. 1). As shown, the signal layer 205 includes a power conductor 240 and a ground conductor 242. The power conductor 240 extends through a portion of the signal layer 205 that extends along the flex section 107. The ground conductor 242 extends through a portion of the signal layer 205 that extends along the flex section 108. Also shown, the signal layer 205 includes signal conductors 244A, 244B, and 244C that extend from the mating panel 102 to the mating panel 104. The signal conductors 244A electrically connect the mating arrays 118A and 124A; the signal conductors 244B electrically connect the mating arrays 118B and 124B; and the signal conductors 244C electrically connect the mating arrays 118C and 124C.

The signal conductors 244A-244C may be characterized as microstrips having dimensions that permit the transmission of data signals between the mating panels 102 and 104. However, as will be described in greater detail below, the power and ground conductors 240 and 242 may have significantly greater dimensions in order to convey a desired amount of power. Also shown in FIG. 4, the power conductor 240 extends parallel to and proximate to a longitudinal edge 250 of the flex section 107. The ground conductor 242 extends parallel to and proximate to a longitudinal edge 252 of the flex section 108.

Figure 5:
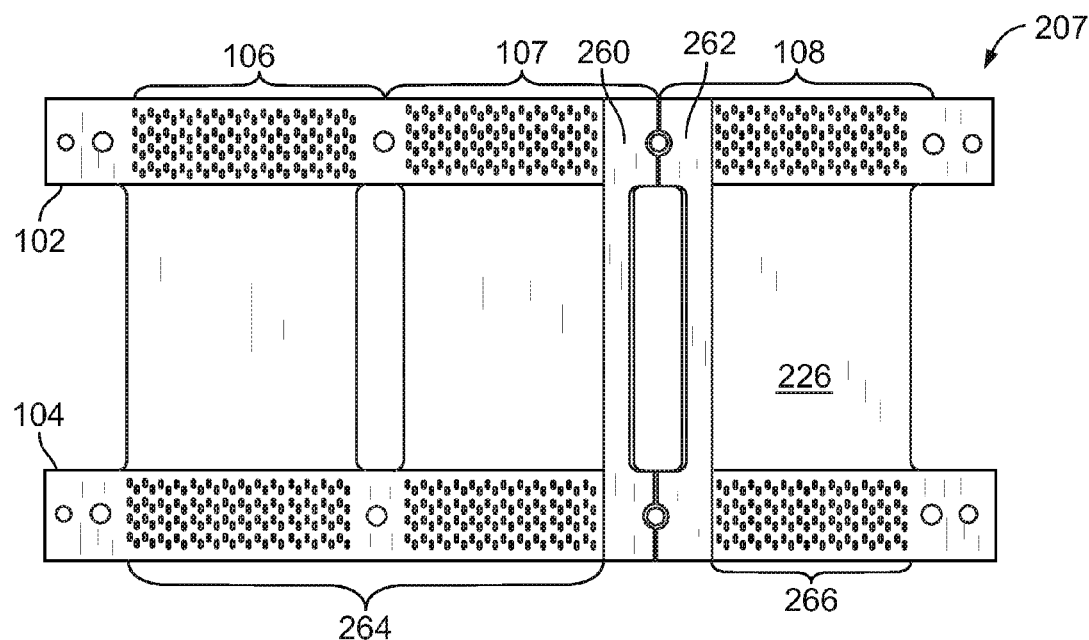
FIG. 5 is a plan view of an impedance-control layer of the circuit assembly shown in FIG. 1.

FIG. 5 is a plan view of the impedance-control layer 207. To manufacture the signal and impedance-control layers 205 and 207, a plate or film strip having the flex layer 206 (FIGS. 2 and 3) and conductive materials 224 and 226 (FIGS. 2 and 3) on opposite sides thereof may be provided. The conductive material 224 may undergo an etching process to provide the signal conductors 244A-244C (FIG. 4) and the power and ground conductors 240 and 242 (FIG. 4). The conductive material 226 may undergo an etching process in which power and ground conductors 260 and 262 are separated from a remainder of the impedance-control layer 207. The remainder of the conductive material 226 of the impedance-control layer 207 may form shields 264 and 266. The shield 264 extends across the flex sections 106 and 107 as well as a portion of the mating panels 102 and 104, and the shield 266 extends across the flex section 108 as well as a portion of the mating panels 102 and 104. The shields 264 and 266 may facilitate controlling an impedance of the signal conductors 244A-244C (FIG. 4).

Although not illustrated in the Figures, the signal and impedance-control layers 214 and 212 of the flex interconnect 112 (all shown in FIG. 3) may have similar features and elements as described above with respect to the signal and impedance-control layers 205 and 207.

Figure 6:
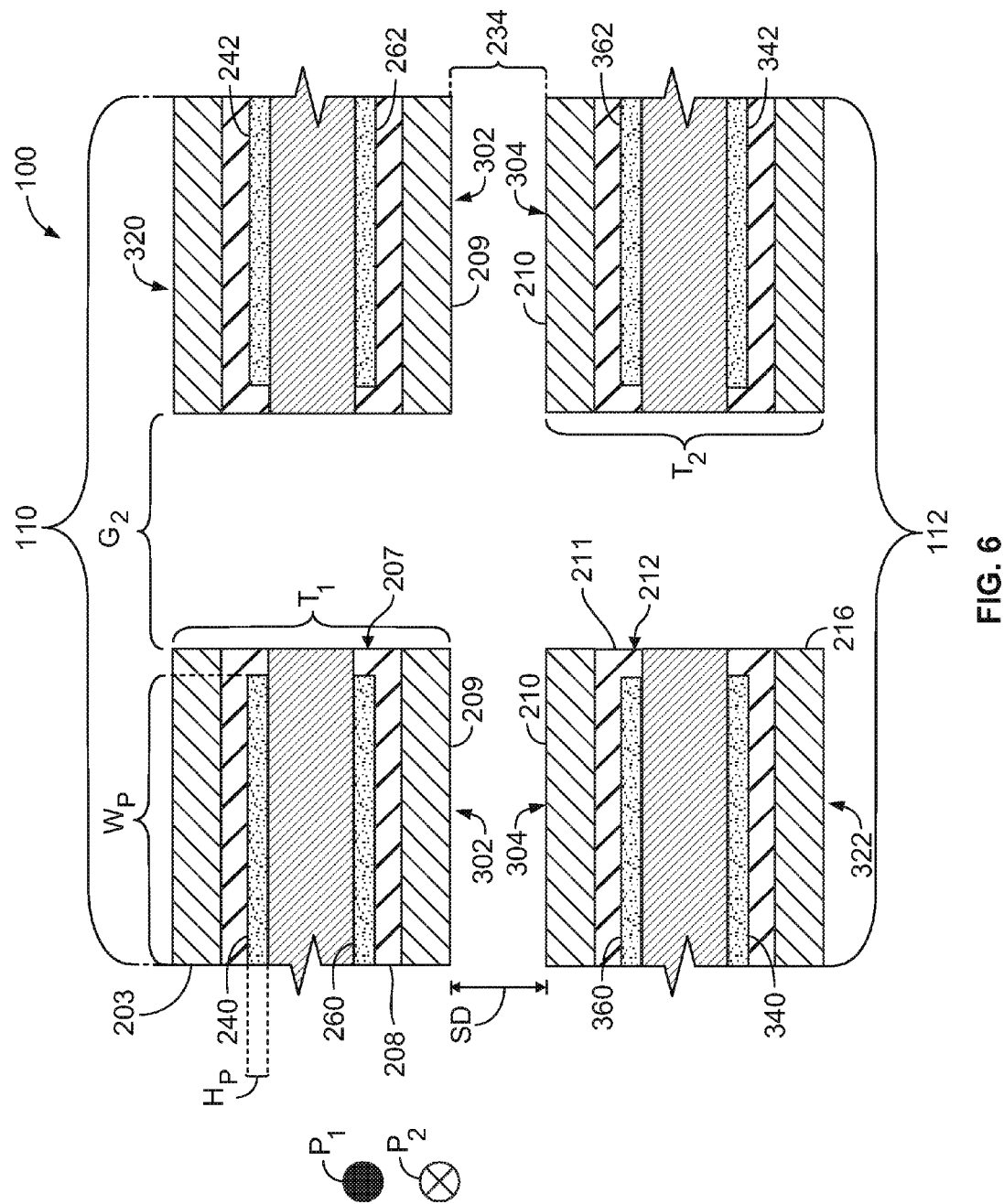
FIG. 6 is schematic cross-section taken along the lines 6-6 in FIG. 1.

FIG. 6 is a cross-section of the flexible circuit assembly 100 illustrating an arrangement of the power conductors 240 and 260 of the flex interconnect 110 and power conductors 340 and 360 of the flex interconnect 112. FIG. 6 also shows the ground conductors 242 and 262 of the flex interconnect 110 and ground conductors 342 and 362 of the flex interconnect 112. In the illustrated embodiment, the power conductors 240, 260, 340, and 360 are stacked with respect to each other. The power conductors 240, 260, 340, and 360 convey electrical current along a path direction $P_1$ that is out of the page. (The path direction $P_1$ is also indicated in FIG. 1.) The ground conductors 242, 262, 342, and 362 convey electrical current along a path direction $P_2$ that is into the page. (The path direction $P_2$ is also indicated in FIG. 1.)

Also shown, the flex interconnects 110 and 112 are adjacent to each other and extend alongside each other to define the interspace 234 therebetween. The interspace 234 is in fluid communication with a gap $G_2$ (also shown in FIG. 1) that extends between the flex sections 107 and 108 (FIG. 1). Ambient air may flow between the interspace 234 and the gap $G_2$. The inner layer 209 of the flex interconnect 110 has an interior surface 302 that extends therealong. The inner layer 210 of the flex interconnect 112 has an interior surface 304 that extends therealong. The flex interconnects 110 and 112 are stacked with respect to each other such that the interior surfaces 302 and 304 face each other and define the interspace 234 therebetween. The interspace 234 may be defined by a separation distance SD between the interior surfaces 302 and 304. Although not shown, spacers may be used to facilitate maintaining the separate distance SD between the interior surfaces 302 and 304. The spacers may comprise flex material, rigid material, and/or bonding material and be located at one or more positions along the bridge distance BD (FIG. 1). The spacers may extend between and adhere to the interior surfaces 302 and 304. In some embodiments, the separation distance SD may be less than one of the thicknesses $T_1$ and $T_2$ of the flex interconnects 110 and 112, respectively. In particular embodiments, the separation distance SD may be about equal to a thickness of one of the stacked layers 201-219 (FIG. 2). In more particular embodiments, a value of the separation distance SD is determined by an amount of bonding material and/or rigid material used by the coupling layers 217 (FIG. 2) to mechanically and electrically couple the flex interconnects 110 and 112.

Embodiments described herein include power conductors in which at least one of the power conductors extends proximate to an interior surface of one of the first and second flex interconnects so that thermal energy generated by the at least one power conductor is dissipated into an interspace. For example, as shown in FIG. 6, the power conductors 260 and 360 are disposed within the impedance-control layers 207 and 212. The impedance-control layers 207 and 212 are covered by the bonding layers 208 and 211, respectively, which directly interface the inner layer 209 and the inner layer 210, respectively. The bonding layers 208 and 211 may comprise a bonding material that is thermally conductive. Thus, in some embodiments, at most two layers extend between the impedance-control layers 207 and 212 and the respective interior surfaces 302 and 304. In such embodiments, the power conductors 260 and 360 may be characterized as extending proximate to the interior surfaces 302 and 304, respectively.

As shown in FIG. 6, the outer layers 203 and 216 include respective exterior surfaces 320 and 322 that interface with ambient air. The exterior surface 320 and the interior surface 302 may face in opposite directions and have the thickness $T_1$ of the flex interconnect 110 extending therebetween. The exterior surface 322 and the interior surface 304 may face in opposite directions and have the thickness $T_2$ of the flex interconnect 112 extending therebetween. The power conductors 240 and 340 may be disposed proximate to the exterior surfaces 320 and 322, respectively, such that at most two layers extend between the power conductors 240 and 340 and the respective exterior surfaces 320 and 322. Thus, in particular embodiments, each and every one of the power conductors extends proximate to one of the interior surfaces or exterior surfaces. For example, as shown in FIG. 6, the power conductors 240 and 340 extend proximate to the exterior surfaces 320 and 322, respectively, and the power conductors 260 and 360 extend proximate to the interior surfaces 302 and 304, respectively. The ground conductors may have similar positions and arrangements with respect to the interior surfaces and the exterior surfaces. For example, as shown in FIG. 6, the ground conductors 242 and 342 extend proximate to the exterior surfaces 320 and 322, respectively, and the ground conductors 262 and 362 extend proximate to the interior surfaces 302 and 304, respectively.

In the illustrated embodiment, the power conductors 240, 260, 340, and 360 are electrically parallel with respect to each other between the power contacts 120 and 126 (FIG. 1). Accordingly, each of the power conductors 240, 260, 340, and 360 conveys a portion of the total current or power that is conveyed between the mating panels 102 and 104. By effectively reducing an amount of current that is transmitted through the electrically parallel power conductors 240, 260, 340, and 360, the power conductors 240, 260, 340, and 360 may have other dimensions that are more suitable for heat dissipation. For example, as shown, each of the power conductors 240, 260, 340, and 360 has a width $W_P$ and a height $H_P$. The widths $W_P$ extend substantially parallel to the interior surfaces 302 and 304. In the illustrated embodiment, the width $W_P$ is significantly greater than the height $H_P$ to facilitate dissipating the thermal energy into the interspace 234. By way of example, a ratio of the $W_P$ to $H_P$ may be about equal to or greater than 5:1. In more particular embodiments, the ratio of the $W_P$ to $H_P$ may be about equal to or greater than 10:1. As such, the power conductors 240, 260, 340, and 360 may have a larger surface area that is located proximate to ambient air as compared to known flexible circuit assemblies.

In some embodiments, the flexible circuit assembly 100 (FIG. 1) may exist in a forced airflow environment. For example, a portion of forced airflow may pass through the interspace 234. The forced airflow may absorb and transfer thermal energy that is dissipated by the flex interconnects 110 and 112 away from the surrounding environment.

When the flex interconnects 110 and 112 are in the unfolded condition and the mating panels 102 and 104 have a maximum bridge distance BD therebetween as shown in FIG. 1, the flex interconnects 110 and 112 may constitute planar sheets of material. As shown in FIG. 6, the interior surfaces 302 and 304 may extend parallel to and spaced apart from each other from the mating panel 102 to the mating panel 104.

Figure 7:
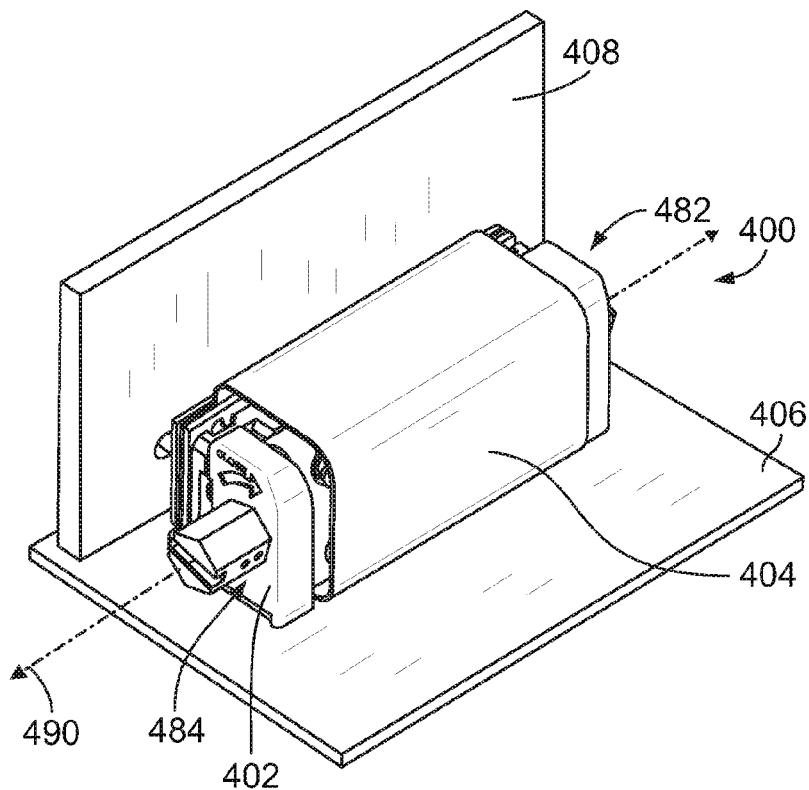
FIG. 7 is perspective view of a connector assembly formed in accordance with one embodiment that includes a flexible circuit assembly.

FIG. 7 is perspective view of a connector assembly 400 formed in accordance with one embodiment. The connector assembly 400 includes a connector 402 and a flexible circuit assembly 404 that is supported by the connector 402. The flexible circuit assembly 404 may have similar features and elements as the flexible circuit assembly 100 (FIG. 1). The connector assembly 400 is configured to communicatively couple electrical components 406 and 408. In the illustrated embodiment, the electrical components 406 and 408 are a motherboard and a daughter card, respectively. However, other types of electrical components may be communicatively coupled by the connector assembly 400. Also shown in FIG. 7, the connector 402 may extend along a longitudinal axis 490 that extends between opposite frame ends 482 and 484 of the connector 402.

Figure 8:
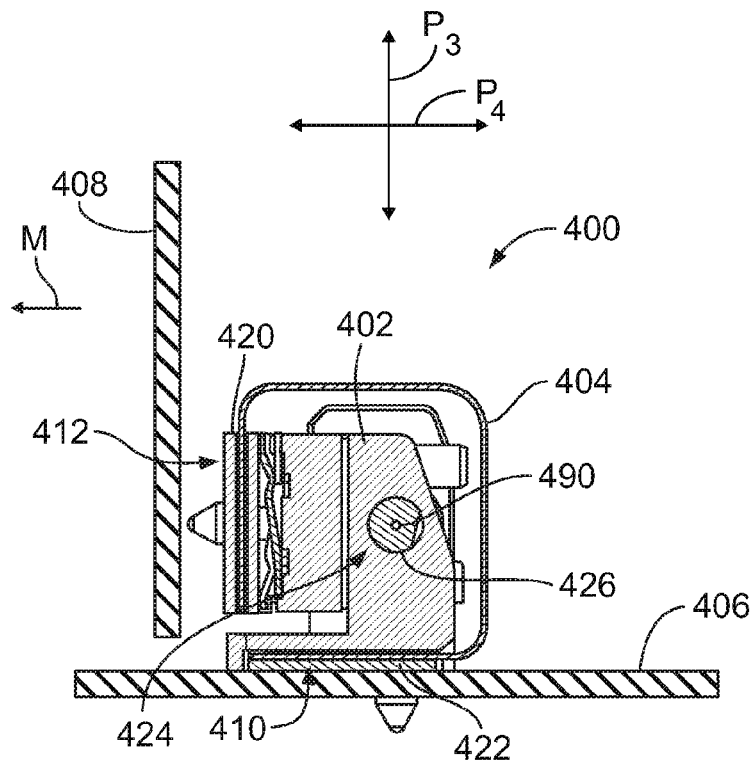
FIG. 8 is a cross-section of the connector assembly shown in FIG. 7 when the connector assembly in a retracted state.
Figure 9:
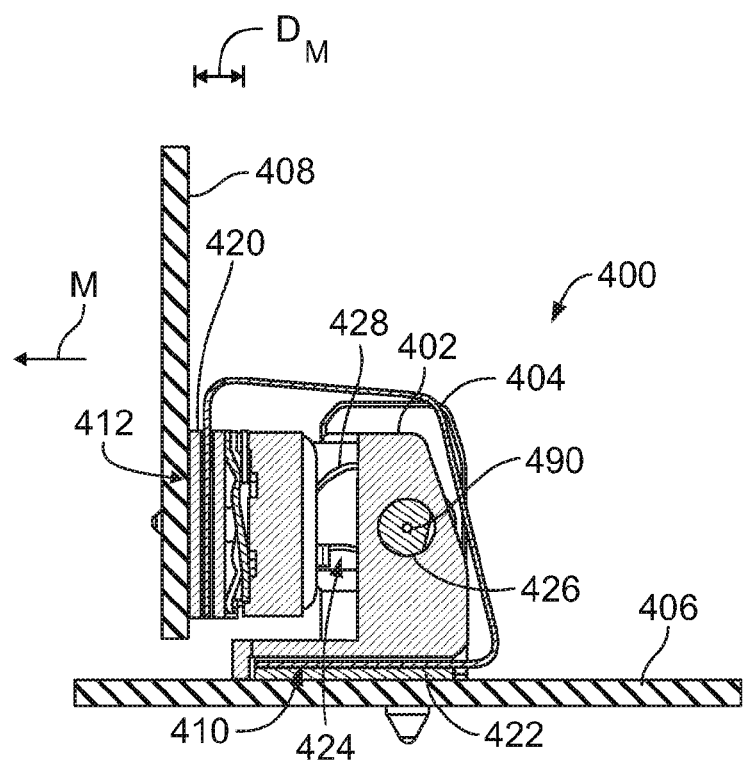
FIG. 9 is a cross-section of the connector assembly shown in FIG. 7 when the connector assembly in an engaged state.

FIGS. 8 and 9 are cross-sections of the connector assembly 400 when the connector assembly 400 is in a retracted state and in an engaged state, respectively. As shown, the connector 402 includes a mounting side 410 and a moveable side 412. The moveable side 412 is configured to retain a first mating panel 420 of the flexible circuit assembly 404, and the mounting side 410 is configured to retain a second mating panel 422 of the flexible circuit assembly 404. When the mating panel 422 is secured to the mounting side 410, the connector assembly 400 may be mounted to the electrical component 406. As shown, the mating panels 420 and 422 may extend in a direction along the longitudinal axis 490. Furthermore, the mating panels 420 and 422 may extend along respective planes $P_3$ and $P_4$ (FIG. 8) when the flexible circuit assembly 404 is in a folded condition. The respective planes $P_3$ and $P_4$ are substantially perpendicular to one another in the illustrated embodiment.

The connector assembly 400 may include various coupling mechanisms 424 that are operatively coupled to the moveable side 412 and configured to drive the moveable side 412 between the retracted position (FIG. 8) and the engaged position (FIG. 9). The coupling mechanism 424 may include a rotatable axle 426 that rotates about the longitudinal axis 490. The rotatable axle 426 may be coupled to cam fingers 428 (FIG. 9) that drive the moveable side 412 in a mating direction M as shown in FIGS. 8 and 9. In other embodiments, the coupling mechanism 424 may include a sliding member that slides in a direction along the longitudinal axis 490. The sliding member may be shaped to include ridges, sloped edges, or cam members that drive the moveable side 412 in the mating direction M. In addition to the above examples, other coupling mechanisms may be used.

Figure 10:
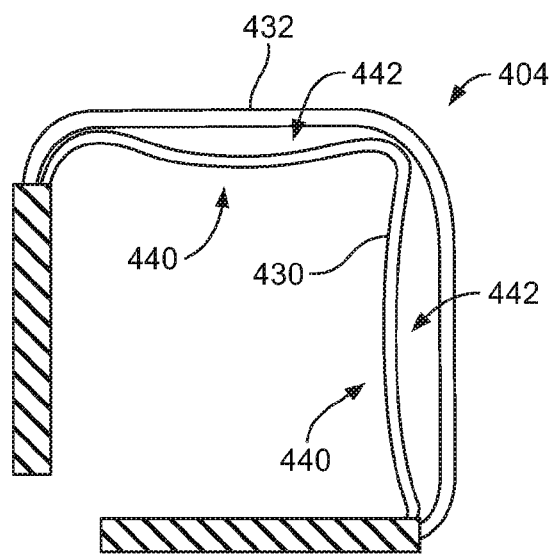
FIG. 10 is an isolated side view of the flexible circuit assembly in a folded condition that may be used with the connector assembly shown in FIG. 7.

FIG. 10 is a side view of a portion of the flexible circuit assembly 404 when arranged in a folded condition. As shown, the flexible circuit assembly 404 has first and second flex interconnects 430 and 432 that may be configured to facilitate heat transfer from the power conductors (not shown). For example, when the flex interconnects 430 and 432 are folded, the flex interconnect 430 may form one or more bent or rounded portions 440. An interspace 442 at the rounded portions 440 may be greater than the interspace 442 when the first and second flex interconnects 430 and 432 are in the unfolded (planar) condition, such as the flexible circuit assembly 100 shown in FIG. 1. Returning to FIGS. 8 and 9, when in the folded condition, the flexible circuit assembly 404 permits the moveable side 412 to move a linear mating distance $D_M$ between the retracted and engaged positions.

Although the illustrated embodiments are described with reference to electrically interconnecting printed circuits and, more specifically, circuit boards, the description herein is not intended to be limited to printed circuits or circuit boards.

Embodiments described herein may also be used to interconnect other electrical components.

Furthermore, it is to be understood that the above description is intended to be illustrative, and not restrictive. In addition, the above-described embodiments (and/or aspects or features thereof) may be used in combination with each other. Furthermore, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A flexible circuit assembly comprising:
   a pair of mating panels, each of the mating panels having an engagement face and a power contact thereon that is configured to electrically engage a corresponding electrical component;
   adjacent first and second flex interconnects that mechanically and electrically couple the mating panels, the first and second flex interconnects extending alongside each other and having respective interior surfaces, the first and second flex interconnects being stacked with respect to each other such that the interior surfaces face each other and define a heat-dissipating interspace therebetween; and
   a plurality of power conductors extending through the first and second flex interconnects between the mating panels, wherein the plurality of power conductors are electrically parallel to one another between the power contacts of the pair of mating panels, at least one of the power conductors extending proximate to the interior surface of one of the first and second flex interconnects so that thermal energy is dissipated into the interspace.

2. The circuit assembly in accordance with claim 1, wherein each of the first and second flex interconnects comprises an inner layer having the respective interior surface and a stacked layer that directly interfaces with the inner layer, at least one of the inner layer and the stacked layer having said at least one of the power conductors.

3. The circuit assembly in accordance with claim 2, wherein each of the first and second flex interconnects comprises an outer layer having an exterior surface, the interior and exterior surfaces for each of the first and second flex interconnects facing in opposite directions, wherein each and every one of the power conductors extends proximate to one of the interior and exterior surfaces.

4. The circuit assembly in accordance with claim 1, wherein the power conductors convey electrical current in a path direction between the pair of mating panels, the power conductors having cross-sections taken perpendicular to the path direction that include a corresponding width and height, the width extending parallel to the interior surface and being significantly greater than the height.

5. The circuit assembly in accordance with claim 1, wherein each of the first and second flex interconnects extends an operative length measured from one of the mating panels to the other mating panel, the operative lengths of the first and second flex interconnects being about equal.

6. The circuit assembly in accordance with claim 1, wherein the first and second flex interconnects constitute planar sheets of material, the interior surfaces extending parallel to each other from one of the mating panels to the other mating panel when the pair of mating panels have a maximum distance between each other.

7. The circuit assembly in accordance with claim 1, wherein the first and second flex interconnects are configured to be arranged into a folded condition, the first flex interconnect forming a rounded portion when in the folded condition, the interspace at the rounded portion being greater than the interspace when the first and second flex interconnects are in an unfolded planar condition.

8. The circuit assembly in accordance with claim 1 further comprising coupling layers that mechanically and electrically couple the first and second flex interconnects at the mating panels, the interspace being defined by a separation distance that is measured between the respective interior surfaces.

9. The circuit assembly in accordance with claim 1, wherein each of the first and second flex interconnects comprises a signal layer, the signal layer including a plurality of signal conductors configured to transmit data signals and at least one of the power conductors.

10. The circuit assembly in accordance with claim 1, wherein the first and second interconnects include respective flex sections that extend from one of the mating panels to the other mating panel, the flex sections of the corresponding flex interconnect being separated from each other by gaps and coplanar with respect to one another.

11. The circuit assembly in accordance with claim 1, wherein the pair of mating panels include respective panel boards that have the engagement faces and the power contacts thereon, the engagement faces further comprising terminals configured to transmit data signals.

12. The circuit assembly in accordance with claim 1, wherein each of the mating panels includes a ground contact, the circuit assembly further comprising a plurality of ground conductors that extend through the first and second flex interconnects between the mating panels, the ground conductors being electrically parallel to one another between the ground contacts.

13. A connector assembly comprising:
   a connector extending along a longitudinal axis, the connector including a moveable side that is configured to move between retracted and engaged positions and also a mounting side; and
   a flexible circuit assembly comprising:
      a pair of mating panels, each of the mating panels having an engagement face and a power contact thereon that is configured to electrically engage a corresponding electrical component, the mounting side having one of the mating panels secured thereto and the moveable side having the other mating panel secured thereto;
      adjacent first and second flex interconnects that mechanically and electrically couple the mating panels, the first and second flex interconnects extending alongside each other and having respective interior surfaces, the first and second flex interconnects being stacked with respect to each other such that the interior surfaces face each other and define a heat-dissipating interspace therebetween; and a plurality of power conductors extending through the first and second flex interconnects between the mating panels, wherein the plurality of power conductors are electrically parallel to one another between the power contacts of the pair of mating panels, at least one of the power conductors extending proximate to the interior surface of one of the first and second flex interconnects so that thermal energy generated by said at least one power conductor is dissipated into the interspace.

14. The connector assembly in accordance with claim 13, wherein the circuit assembly is arranged into a folded condition, the circuit assembly permitting the moveable side to move a linear mating distance between the retracted and engaged positions when in the folded condition.

15. The connector assembly in accordance with claim 14, wherein the mating panels extend along respective planes when the circuit assembly is in the folded condition, the respective planes being substantially perpendicular to one another.

16. The connector assembly in accordance with claim 13, wherein each of the first and second flex interconnects comprises an inner layer having the respective interior surface and a stacked layer that directly interfaces with the inner layer, at least one of the inner layer and the stacked layer having said at least one of the power conductors extending proximate to the interior surface.

17. The connector assembly in accordance with claim 16, wherein each of the first and second flex interconnects comprises an outer layer having an exterior surface, the interior and exterior surfaces for each of the first and second flex interconnects facing in opposite directions, wherein each and every one of the power conductors extends proximate to one of the interior and exterior surfaces.

18. The connector assembly in accordance with claim 13, wherein the power conductors convey electrical current in a path direction between the pair of mating panels, the power conductors having cross-sections taken perpendicular to the path direction that include a corresponding width and height, the width extending parallel to the interior surface and being significantly greater than the height.

19. The connector assembly in accordance with claim 13, wherein each of the first and second flex interconnects extends an operative length measured from one of the mating panels to the other mating panel, the operative lengths of the first and second flex interconnects being approximately equal.

20. The connector assembly in accordance with claim 13, wherein the first and second flex interconnects constitute planar sheets of material, the interior surfaces extending parallel to each other from one of the mating panels to the other mating panel when the pair of mating panels have a maximum distance between each other.

* * * * *